(12) United States Patent
Kang

(10) Patent No.: US 8,253,151 B2
(45) Date of Patent: Aug. 28, 2012

(54) NITRIDE SEMICONDUCTOR LIGHT-EMITTING DEVICE

(75) Inventor: Dae Sung Kang, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 844 days.

(21) Appl. No.: 11/657,606

(22) Filed: Jan. 25, 2007

(65) Prior Publication Data

US 2007/0176162 A1 Aug. 2, 2007

(30) Foreign Application Priority Data

Jan. 27, 2006 (KR) .................. 10-2006-0008784

(51) Int. Cl.
*H01L 33/00* (2010.01)
*H01L 29/06* (2006.01)

(52) U.S. Cl. ....... 257/94; 257/14; 257/96; 257/E33.005; 257/E33.023

(58) Field of Classification Search ............ 257/13, 257/14, 79, 94, 96, E33.001, E33.003, E33.023, 257/E33.005
See application file for complete search history.

(56) References Cited

U.S. PATENT DOCUMENTS

| | | | | |
|---|---|---|---|---|
| 6,821,804 B2* | 11/2004 | Thibeault et al. | ............... | 438/29 |
| 6,828,591 B2* | 12/2004 | Okuyama et al. | ............... | 257/89 |
| 2001/0038103 A1* | 11/2001 | Nitta et al. | .................... | 257/103 |
| 2003/0180977 A1* | 9/2003 | Suzuki et al. | .................. | 438/22 |
| 2005/0056850 A1* | 3/2005 | Taki | ............................ | 257/79 |
| 2005/0230688 A1* | 10/2005 | Lee | ............................... | 257/79 |
| 2005/0236631 A1* | 10/2005 | Lee | ............................... | 257/81 |
| 2008/0149955 A1 | 6/2008 | Nakamura et al. | | |

FOREIGN PATENT DOCUMENTS

| | | |
|---|---|---|
| JP | 2000-68594 A | 3/2000 |
| JP | 2003-92426 A | 3/2003 |
| JP | 2006-5044 A | 1/2006 |
| KR | 10-2005-0041536 A | 5/2005 |

OTHER PUBLICATIONS

English machine translation of JP-2003-92426-A, dated Mar. 28, 2003.
English machine translation of JP-2006-5044-A, dated Jan. 5, 2006.
English translation of KR-10-2005-0041536-A, dated May 4, 2005.

* cited by examiner

*Primary Examiner* — Shouxiang Hu
(74) *Attorney, Agent, or Firm* — Birch, Stewart, Kolasch & Birch, LLP

(57) ABSTRACT

A semiconductor light emitting device is provided. The semiconductor light emitting device includes a first nitride layer, an active layer, and a second nitride layer. The first nitride layer includes an irregular, uneven surface, and the active layer is formed on the irregular, uneven surface. The second nitride layer is formed on the active layer. A plurality of quantum dots are formed at the active layer.

41 Claims, 6 Drawing Sheets

NITRIDE SEMICONDUCTOR LIGHT-EMITTING DEVICE

BACKGROUND OF THE INVENTION

1. Field of the Invention

The present invention relates to a nitride semiconductor light-emitting device, and a method for manufacturing the same.

2. Description of the Related Art

An example of a related art nitride semiconductor may include a GaN-based nitride semiconductor. The GaN-based nitride semiconductor is being applied to a variety of application fields such as an optical device including blue/green light emitting diodes (LEDs), and a fast-switching high-output device including a metal-semiconductor field effect transistor (MESFET) and a high electron mobility transistor (HEMT). Particularly, the blue/green LEDs have already been mass-processed, and the worldwide sales thereof are exponentially increasing.

Particularly, in the field of light emitting devices such as LEDs and semiconductor laser diodes among the application fields of the GaN-based nitride semiconductor, a semiconductor light emitting device that includes a crystal layer made by doping a Ga location of a GaN-based nitride semiconductor with the group 2 element such as magnesium and zinc is receiving much attention as a blue light emitting device.

As illustrated in FIG. 1, an example of the GaN-based nitride semiconductor may include a light-emitting device having a multiple quantum well structure. The light-emitting device is grown on a substrate 1 formed mainly of sapphire or SiC. For example, a polycrystalline thin film of $Al_yGa_{1-y}N$ is grown as a buffer layer 2 on the substrate 1 of sapphire or SiC at a low growth temperature. Then, a GaN underlayer 3 is sequentially stacked on the buffer layer 2 at a high temperature. An active layer 4 for light emission is placed on the GaN underlayer 3. A magnesium (Mg)-doped AlGaN electron barrier layer 5, a Mg-doped InGaN layer 6, and a Mg-doped GaN layer 7 that are converted into a p-type by a thermal annealing process are sequentially stacked on the active layer 4.

An insulating layer is formed on the Mg-doped GaN layer 7 and the GaN underlayer 3, and a p-type electrode 9 and an n-type electrode 10 are formed corresponding to the Mg-doped GaN layer 7 and the GaN layer 3, respectively, thereby forming a light emitting device.

Such a related art light emitting device has the following problems. First, in the nitride semiconductor light-emitting device, lattice mismatch exists between the substrate and the GaN, and thus many crystal defects (surface defects, point defects, line defects) occur in an n-type nitride layer or a p-type nitride layer which has undergone crystal growth. Hence, it becomes difficult to achieve good quality of a crystal layer.

Also, at the time of Mg doping for forming a p-type contact layer, Mg is combined with H of an ammonia gas, thereby forming a Mg—H combination having an electrical insulating property. Thus, even if a large amount of Mg is doped, it is difficult to achieve high hole-concentration in a p-type GaN.

In general, it has been known that quantum dots formed in InGaN and GaN epilayers used as an active layer take prominent part in increasing attention on the nitride semiconductor material as a high-output optical device despite its disadvantages of dislocations, defects and an electromagnetic field in a crystal. Such quantum dots perform strong lateral confinement or localization on carriers (electrons and holes) to remarkably reduce an influence of the dislocation or the electromagnetic field.

Specifically, electrons of a conduction band and holes of a valence band in an active layer having a quantum well structure are trapped in the quantum dots, increasing the density states of the electrons and the holes in the quantum dots. Thus, light-emission recombination efficiency of the electrons and the holes effectively increases. Also, a refractive index of the quantum dot is greater than a refractive index of a semiconductor material surrounding the quantum dot. For this reason, photons generated at the quantum dots are spatially trapped near to the quantum dots. Such an active layer structure of the light emitting device simultaneously confines both carriers and photons in the center of an optical waveguide, so that a threshold current of the light emitting device can be reduced approximately tens of times, and temperature stability can be improved to an extent that allows consecutive operation of the light emitting device at a room temperature.

Accordingly, in order to improve light emission efficiency of the nitride semiconductor light-emitting device, it is most important to develop a technology for controlling quantum dots of the active layer.

SUMMARY OF THE INVENTION

Accordingly, the present invention is directed to a nitride semiconductor light emitting device and a method for manufacturing the same that substantially obviate one or more problems due to limitations and disadvantages of the related art.

The embodiment of the invention provides a nitride semiconductor light emitting device capable of improving light emission efficiency by controlling the size and density of quantum dots and using a diffused reflection effect of a surface of an n-type nitride layer, and a method for manufacturing the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

The embodiment of the invention provides a nitride semiconductor light emitting device including: a first nitride layer including an irregular, uneven surface; an active layer on the irregular, uneven surface; and a second nitride layer on the active layer, wherein the active layer includes a plurality of quantum dots.

The another embodiment of the invention provides a method for manufacturing a nitride semiconductor light emitting device, including: forming a first nitride layer on a substrate, the first nitride layer including an irregular, uneven surface; forming an active layer along the irregular, uneven surface; and forming a second nitride layer on the active layer.

It is to be understood that both the foregoing general description and the following detailed description of the present invention are exemplary and explanatory and are intended to provide further explanation of the invention as claimed.

DETAILED DESCRIPTION OF THE INVENTION

Hereinafter, a nitride semiconductor light emitting device and a method for manufacturing the same according to embodiments of the present invention will now be described with reference to accompanying drawings.

It will be understood that when a layer is referred to as being 'on' another layer or substrate, it can be directly on the other layer or substrate, or intervening layers may also be present.

Although a nitride semiconductor light emitting device according to an embodiment of the present invention is applied to, for example, a light emitting device having a quantum well structure (QW), the present invention may, however, be embodied in different forms and should not be constructed as limited to the embodiment.

Figure 1:
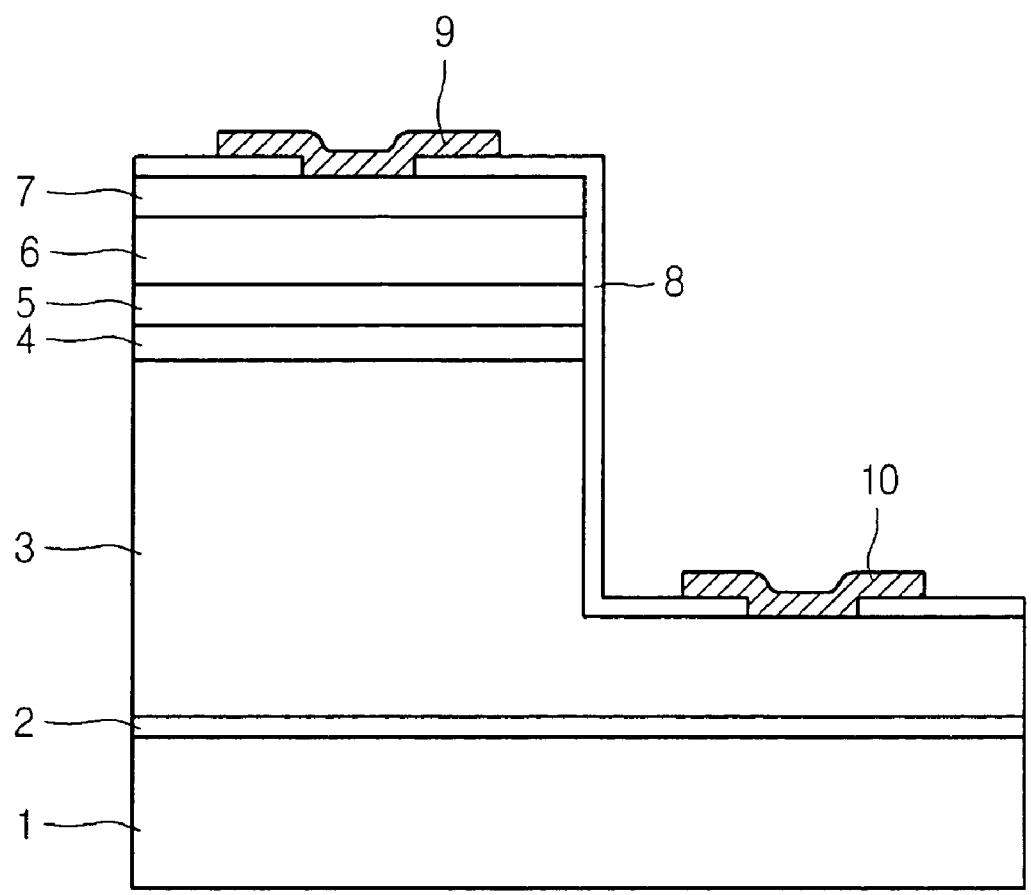
FIG. 1 is a cross-sectional view of a related art nitride semiconductor light-emitting device.
Figure 2:
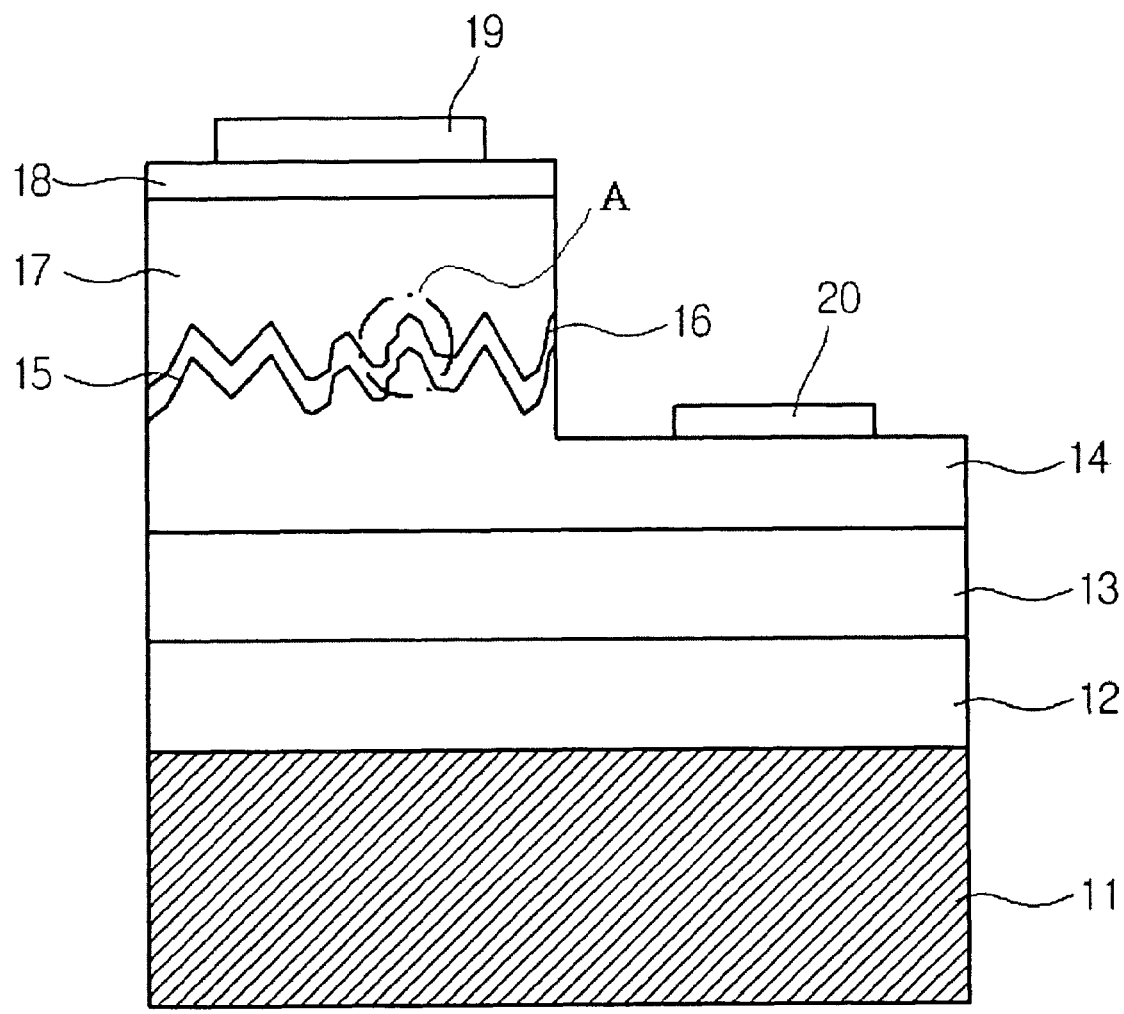
FIG. 2 is a cross-sectional view of a nitride semiconductor light-emitting device according to an embodiment of the present invention.

FIG. 2 is a cross-sectional view of a nitride semiconductor light-emitting device according to an embodiment of the present invention.

Figure 3:
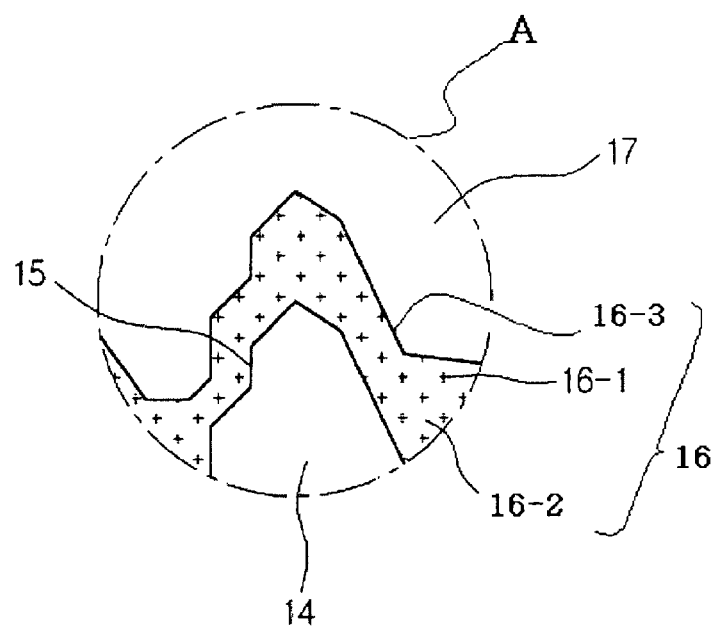
FIG. 3 is an enlarged view for describing a quantum dot area formed in a nitride semiconductor light-emitting-device according to an embodiment of the present invention.

Also, FIG. 3 is an enlarged view for describing a quantum dot area (A) formed in an active layer of a nitride semiconductor light-emitting device according to an embodiment of the present invention.

Referring to FIG. 2, the nitride semiconductor light emitting device according to an embodiment of the present invention includes a substrate 11 of any one of sapphire, SiC or Si, a GaN buffer layer 12 of GaN on the substrate 11, an un-doped GaN layer 13 on the GaN buffer layer 12, a first n-type GaN layer 14 on the undoped GaN layer 13, the first n-type GaN layer 14 having a rough (i.e., uneven) interface 15, an active layer 16 on the interface 15, the active layer 16 including a plurality of quantum dots 16-1, and a p-type GaN layer 17 on the active layer. Also, a thin second n-type GaN layer 18 may be further provided on the p-type GaN layer 17. Thereafter, a p-type electrode 19 and an n-type electrode 20 are provided for electrical connection, thereby completing a light emitting device according to an embodiment of the present invention.

Here, although the active layer 16 is illustrated as just a layer in FIG. 2, the active layer 16 may include one or more wells 16-2 and a barrier 16-3 as illustrated in FIG. 3.

The semiconductor light-emitting device according to the present invention includes the first n-type GaN layer 14 including n-type dopants, and the active layer 16 formed of, for example, InGaN or the like. A plurality of quantum dots 16-1 are distributed in the active layer 16 formed along the interface 15. Here, in comparison with the related art, those quantum dots 16-1 may be distributed at a higher density since more quantum dots are formed at an inclined area than those at a plane area by nature.

According to the present invention, the quantum dots 16-1 formed in the active layer 16 with high density prevent defects, which are caused by lattice mismatch of nitride layers such as the substrate 11 and the GaN buffer layer 12, from being transmitted to the active layer 16 and the p-type GaN layer 17. Thus, the formation of a faulty semiconductor layer having disadvantageous of, for example, defects or dislocation can be prevented.

Also, the quantum dots 16-1 laterally confine or localize carriers such as electrons or holes, so that an influence of dislocation or an electromagnetic field can be considerably reduced.

Accordingly, the characteristic of the active layer 16 is improved by the plurality of quantum dots 16-1 formed at the active layer 16, so that the light emission efficiency can be desirably improved.

Hereinafter, a process of manufacturing a nitride semiconductor light-emitting device according to an embodiment of the present invention will now be described.

FIGS. 4 through 7 are cross-sectional views for describing a process of manufacturing a nitride semiconductor light emitting device according to an embodiment of the present invention.

Figure 4:
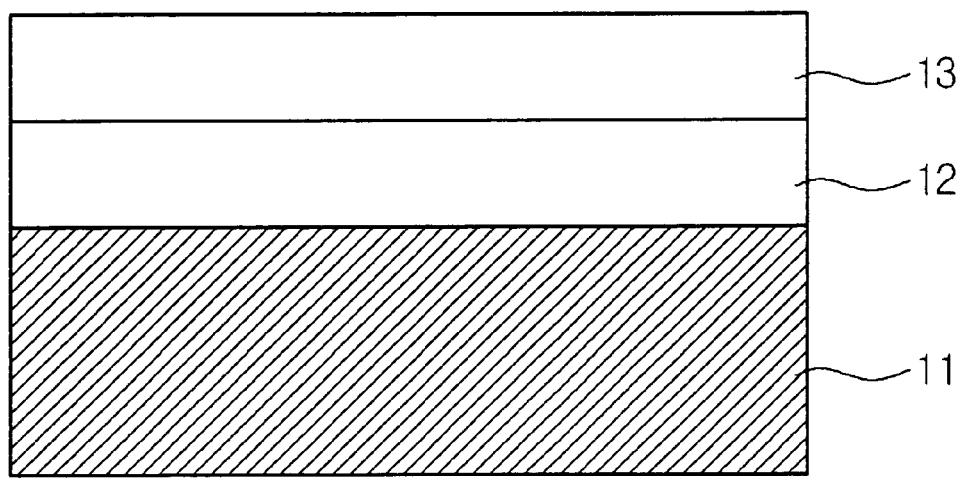
FIGS. 4 through 7 are cross-sectional views for describing a method for manufacturing a nitride semiconductor light-emitting device according to an embodiment of the present invention.

Referring to FIG. 4, a GaN buffer layer 12 and an un-doped GaN layer 13 are formed on a substrate 11. For example, the GaN buffer layer is formed at a temperature ranging from about 500° C. to 600° C. in a state where the substrate is mounted to a metalorganic chemical vapor deposition (MOCVD) reactor (not shown).

Ammonia ($NH_3$) and trimethyl gallium (TMG) are supplied on the GaN buffer layer 12 at a growth temperature of about 1000° C. or higher. In this manner, the un-doped GaN layer 13 including no dopants is formed on the GaN buffer layer 12 to a predetermined thickness.

Figure 5:
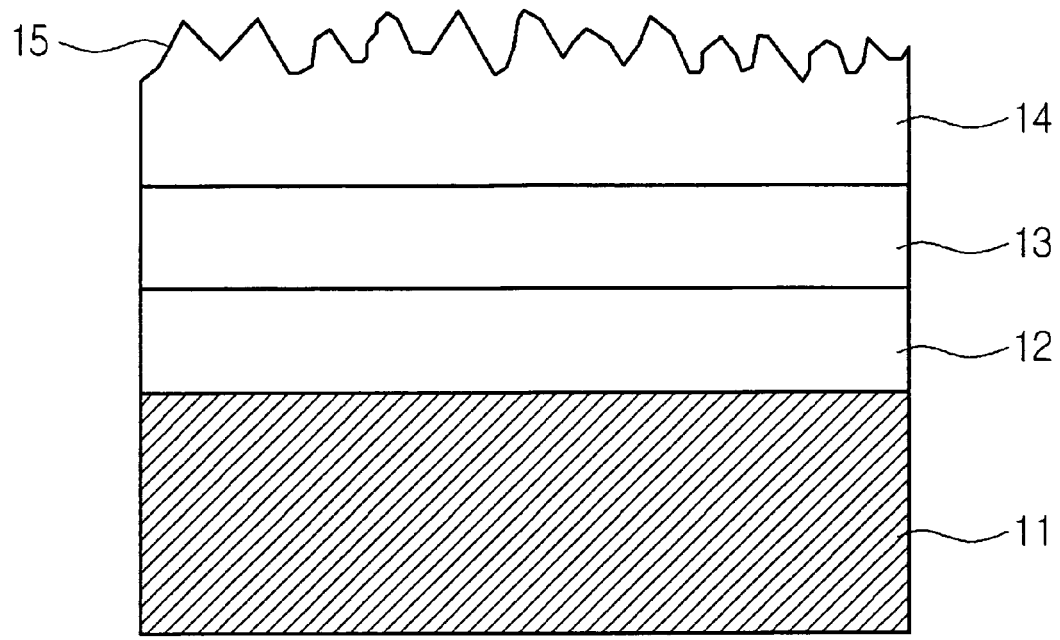

Referring to FIG. 5, in order to form a first n-type GaN layer 14 including n-type dopants on the un-doped GaN layer 13, a silane gas including n-type dopants such as $NH_3$, TMG and SI is supplied at a growth temperature of, for example, about 1000° C. or higher.

After the first n-type GaN layer 14 is formed to a predetermined thickness, the first n-type GaN layer is irregularly grown to form an interface 15 having a predetermined irregular, uneven structure. A rough surface of the first n-type GaN layer 14, that is, the interface 15 is formed such that the first n-type GaN layer 14 is irregularly grown by controlling the flow amount of $NH_3$ and the amount of n-type dopants at an atmosphere temperature ranging from about 500° C. to 800° C.

Here, in order to form the rough surface, that is, the interface 15, $NH_3$ and n-type dopants are implanted in quantities of half the flow amount of $NH_3$ and double the amount of n-type as compared to quantities of $NH_3$ and n-type dopants that form a flat n-GaN layer with the same thickness. In such a manner, the first n-type GaN layer 14 has the rough interface 15.

The rough interface 15 of the first n-type GaN layer 14 causes a plurality of quantum dots 16-1 to occur at an active layer 16 to be formed later.

Figure 6:
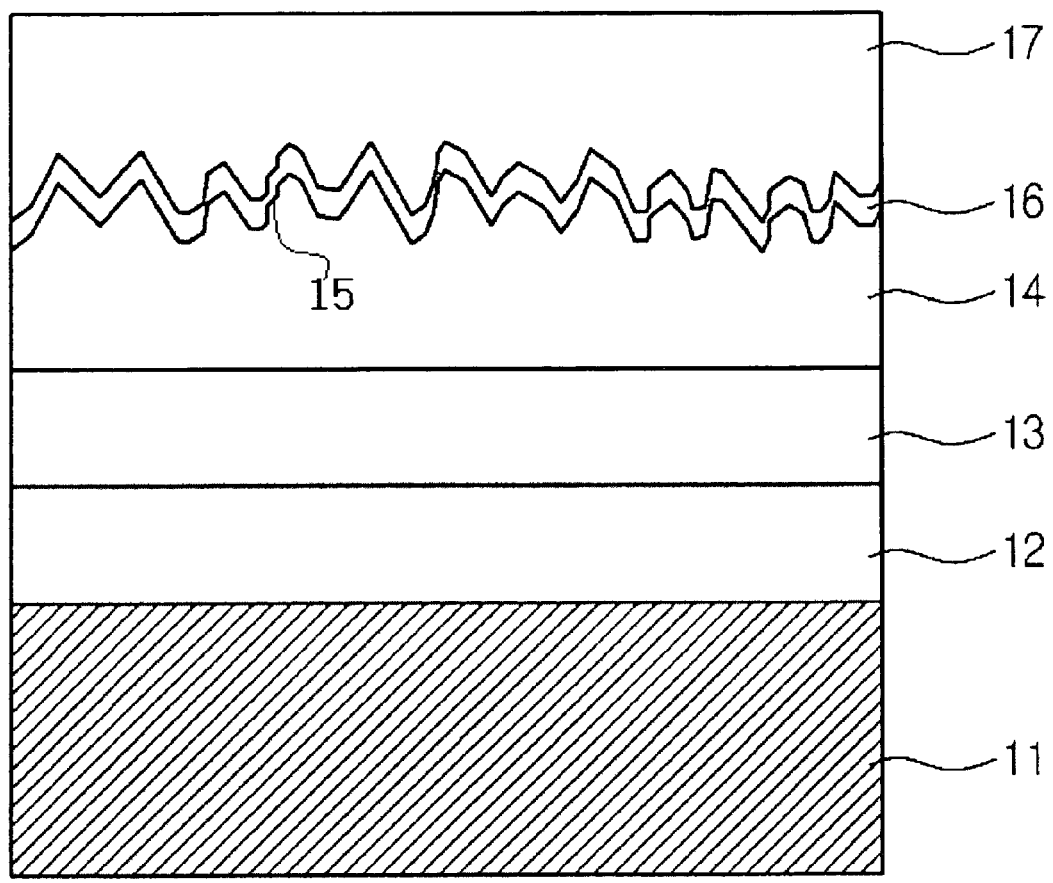

After the first n-type GaN layer 14 having the rough interface 15 is formed, as illustrated in FIG. 6, an active layer 16 is formed on the first n-type GaN layer 14.

The active layer 16 is formed by growing a layer to a predetermined thickness at a growth temperature of about 780° C., using nitrogen as a carrier gas, for example, by supplying $NH_3$, TMG and TMIn. Here, the predetermined thickness of the active layer 16 may be about 120 Å-150 Å per one growth cycle.

Also, the active layer 16 may have a stacked structure including a plurality of layers through five to nine growth cycles if necessary. Here, as for the composition of the active layer having the stacked structure, the layer may be grown with the molar fraction of each element, such as InGaN, varied.

During the active layer forming process, much more quantum dots 16-1 are formed by the rough surface, that is, the interface 15 of the first n-type GaN layer 14. This is because more quantum dots 16-1 are formed by In on an inclined side than those on a plane side.

After the active layer 16 is formed, as illustrated in FIG. 6, a p-type GaN layer 17 is successively formed on the active layer 16. Here, in order to form the p-type GaN layer 17, for example, a Mg-based group 2 element may be used for doping.

Thereafter, as illustrated in FIG. 2, a p-type electrode 20 may be formed on the p-type GaN layer 17. Portions of the p-type GaN layer 17, the active layer 16 and the first n-type GaN layer 14 are etched to expose the first n-type GaN layer 14. Thus, an n-type electrode 20 forms an electric contact on the first n-type GaN layer 14.

Figure 7:
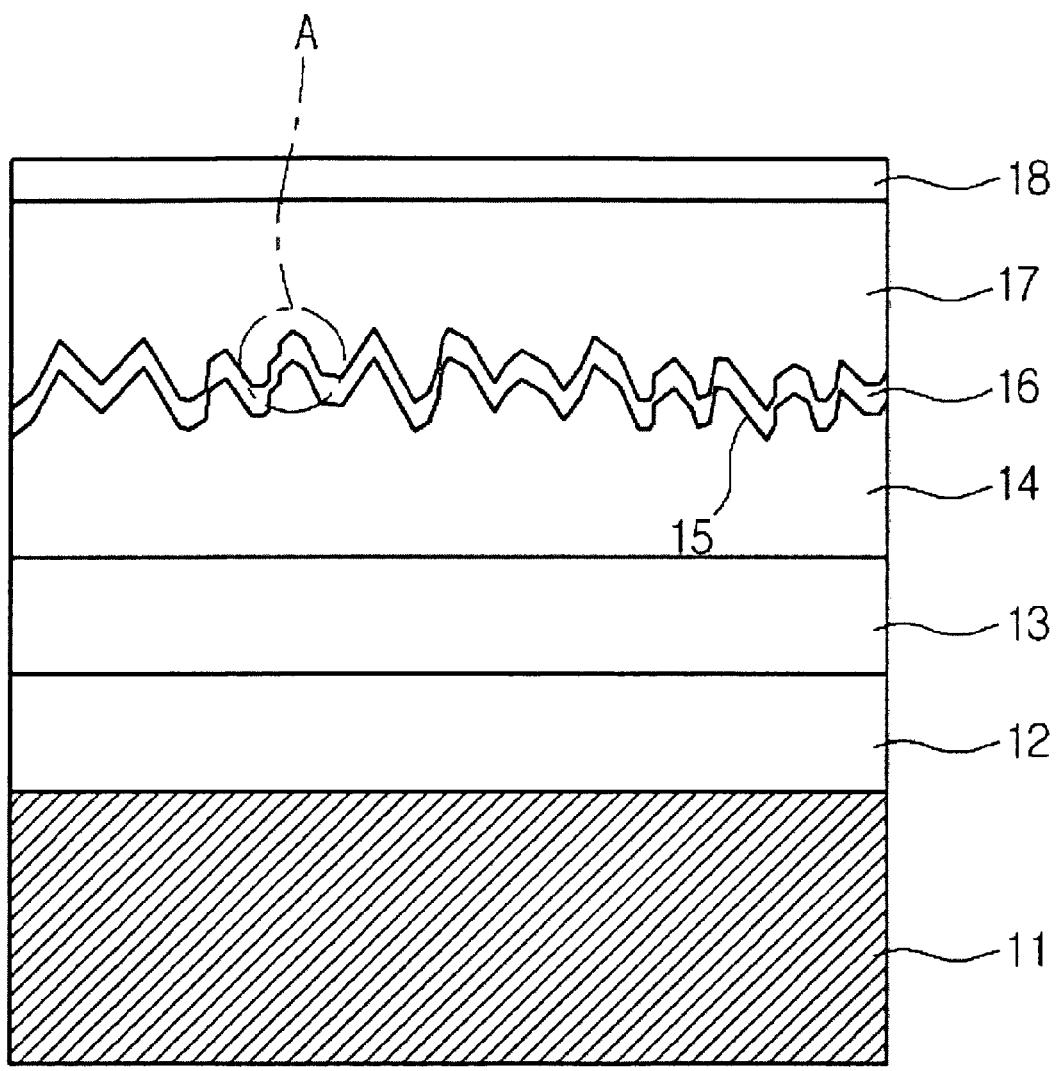

In another embodiment of the present invention, as illustrated in FIG. 7, a thin second n-type GaN layer 18 may be further grown on the p-type GaN layer 17.

As described so far, in the nitride semiconductor light-emitting device, and the method for manufacturing the same according to an embodiment of the present invention, the rough interface 15 having an irregular, uneven structure is formed between the active layer 16 and the first n-type GaN layer 14. The rough interface 15 serves to increase the density of quantum dots 16-1 formed at the active layer 16, thereby improving light emission efficiency.

Also, according to the present invention, the quantum dots 16-1 obviate lattice mismatch, thereby achieving good quality of an active layer 16. Also, a diffused reflection effect of light generated from the active layer 16 can occur by the interface 15 with the rough surface, so that the light emission efficiency can be further improved.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A semiconductor light emitting device, comprising:
   a substrate;
   a first gallium nitride based semiconductor layer doped with a first dopant on the substrate;
   an active layer on the first gallium nitride based semiconductor layer, the active layer including an InGaN material, and a first uneven structure having at least one first inclined surface; and
   a second gallium nitride based semiconductor layer doped with a second dopant on the active layer,
   wherein the active layer includes at least one in-rich region at the at least one first inclined surface of the first uneven structure, and the first gallium nitride based semiconductor layer comprises a second inclined surface with the active layer formed by protrusions,
   wherein the active layer comprises five to nine periods, and one period includes a well and a barrier,
   wherein a distance between an uppermost portion of the second inclined surface and a lowermost portion of the second inclined surface in a vertical direction is greater than a thickness of the one period of the active layer, and
   wherein the active layer comprises a plurality of vertical distances of different thicknesses.

2. The device according to claim 1, wherein quantum dots are formed at the at least one first inclined surface.

3. The device according to claim 1, wherein the active layer has a thickness ranging from about 120 Å to 150 Å per the one period.

4. The device according to claim 1, further comprising:
   a buffer layer on the substrate; and
   an un-doped gallium nitride based semiconductor layer on the buffer layer,
   wherein the first gallium nitride based semiconductor layer is on the un-doped gallium nitride based semiconductor layer.

5. The device according to claim 1, further comprising a third gallium nitride based semiconductor layer on the second gallium nitride based semiconductor.

6. The device according to claim 5, wherein the third gallium nitride based semiconductor layer comprises at least one n-type gallium nitride based semiconductor layer.

7. The device according to claim 1, wherein the first gallium nitride based semiconductor layer comprises at least one n-type gallium nitride based semiconductor layer and the second gallium nitride based semiconductor layer comprises at least one p-type gallium nitride based semiconductor layer.

8. The device according to claim 1, wherein the second inclined surface of the first gallium nitride based semiconductor layer is irregular.

9. The device according to claim 1, wherein the first uneven structure improves light emission efficiency, or a diffused reflection effect of light generated from the active layer occurs by the at least one first inclined surface of the first uneven structure.

10. The device according to claim 1, wherein the substrate comprises at least one of sapphire, SiC and Si.

11. The device according to claim 1, wherein the second inclined surface of the first gallium nitride based semiconductor layer contacts the first uneven structure of the active layer.

12. The device according to claim 1, wherein the second gallium nitride based semiconductor layer comprises a third inclined surface.

13. The device according to claim 12, wherein the third inclined surface of the second gallium nitride based semiconductor layer contacts the first uneven structure of the active layer.

14. The device according to claim 1, wherein the first uneven structure is formed irregularly.

15. The device according to claim 1, wherein the first gallium nitride based semiconductor layer extends from the substrate to the protrusions without an intervening interface.

16. A semiconductor light emitting device, comprising:
   a first gallium nitride based semiconductor layer;
   an active layer on the first gallium nitride based semiconductor layer, the active layer including an uneven structure having a first inclined surface; and
   a second gallium nitride based semiconductor layer on the active layer,
   wherein the active layer includes at least one In-rich region at the first inclined surface of the uneven structure, the first gallium nitride based semiconductor layer comprises a second inclined surface, and at least one of the first inclined surface of the uneven structure and the second inclined surface of the first gallium nitride based semiconductor layer has vertices of different heights,
   wherein the active layer comprises five to nine periods, and one period includes a well and a barrier, and
   wherein a distance between an uppermost portion of the second inclined surface and a lowermost portion of the second inclined surface in a vertical direction is greater than a thickness of the one period of the active layer.

17. The device according to claim 16, wherein the uneven structure is formed irregularly.

18. The device according to claim 16, further comprising:
a substrate;
a buffer layer on the substrate; and
an un-doped gallium nitride based semiconductor layer on the buffer layer,
wherein the first gallium nitride based semiconductor layer is on the un-doped gallium nitride based semiconductor layer.

19. The device according to claim 16, further comprising a third gallium nitride based semiconductor layer on the second gallium nitride based semiconductor layer.

20. The device according to claim 16, wherein the first gallium nitride based semiconductor layer comprises at least one n-type gallium nitride based semiconductor layer and the second gallium nitride based semiconductor layer comprises at least one p-type gallium nitride based semiconductor layer.

21. The device according to claim 16, wherein the at least one In-rich region comprises a plurality of quantum dots.

22. The device according to claim 16, wherein the active layer comprise at least one InGaN layer.

23. The device according to claim 16, wherein the active layer has a thickness ranging from about 120 Å to 150 Å per the one period.

24. The device according to claim 16, wherein the second inclined surface of the first gallium nitride based semiconductor layer contacts the uneven structure of the active layer.

25. The device according to claim 16, wherein the second gallium nitride based semiconductor layer comprises a third inclined surface.

26. The device according to claim 25, wherein the third inclined surface of the second gallium nitride based semiconductor layer contacts the uneven structure of the active layer.

27. The device according to claim 16, further comprising a substrate including at least one of sapphire, SiC and Si.

28. A semiconductor light emitting device, comprising:
a first gallium nitride based semiconductor layer;
an active layer on the first gallium nitride based semiconductor layer, the active layer including at least one uneven structure having first inclined surfaces; and
a second gallium nitride based semiconductor layer on the active layer,
wherein the active layer includes at least one In-rich region at the first inclined surfaces of the at least one uneven structure, the first gallium nitride based semiconductor layer comprises second inclined surfaces with the active layer formed by protrusions, and at least one of the first inclined surfaces of the uneven structure and the second inclined surfaces of the first gallium nitride based semiconductor layer comprise at least one substantially V shape in a sectional view,
wherein the first inclined surfaces have the at least one substantially V shape in a sectional view, the at least one substantially V shape has a vertex, and the vertex of the first inclined surfaces is positioned towards the first gallium nitride based semiconductor layer or contacts the first gallium nitride based semiconductor layer,
the active layer has a thickness ranging from about 120 Å to 150 Å per one period including a well and a barrier,
wherein a distance between an uppermost portion of the second inclined surfaces and a lowermost portion of the second inclined surfaces in a vertical direction is greater than a thickness of the one period of the active layer, and
wherein the active layer comprises a plurality of vertical distances of different thicknesses.

29. The device according to claim 28, wherein an opposite side of the substantially V shape from the vertex contacts the second gallium nitride based semiconductor layer.

30. The device according to claim 28, wherein the at least one uneven structure is formed irregularly.

31. The device according to claim 28, wherein the at least one uneven structure comprises a rough surface.

32. The device according to claim 28, wherein the active layer comprises at least one well and at least one barrier.

33. The device according to claim 28, further comprising:
a substrate;
a buffer layer on the substrate;
an un-doped gallium nitride based semiconductor layer on the buffer layer,
wherein the first gallium nitride based semiconductor layer is on the un-doped gallium nitride based semiconductor layer.

34. The device according to claim 28, further comprising a third gallium nitride based semiconductor layer on the second gallium nitride based semiconductor layer.

35. The device according to claim 28, wherein the first gallium nitride based semiconductor layer comprises at least one n-type gallium nitride based semiconductor layer and the second gallium nitride based semiconductor layer comprises at least one p-type gallium nitride based semiconductor.

36. The device according to claim 28, wherein the active layer comprises at least one InGaN layer.

37. The device according to claim 28, further comprising a substrate including at least one of sapphire, SiC and Si.

38. The device according to claim 28, wherein the active layer comprises five to nine periods of the well and the barrier.

39. A semiconductor light emitting device, comprising:
a substrate;
a first gallium nitride based semiconductor layer doped with a first dopant on the substrate;
an active layer on the first gallium nitride based semiconductor layer, the active layer including an InGaN material, and a first uneven structure having at least one first inclined surface; and
a second gallium nitride based semiconductor layer doped with a second dopant on the active layer,
wherein the active layer includes at least one In-rich region at the at least one first inclined surface of the first uneven structure, and the first gallium nitride based semiconductor layer comprises a second inclined surface with the active layer formed by protrusions,
wherein the active layer further includes at least one period, wherein one period of the at least one period includes a well and a barrier,
wherein a distance between an uppermost portion of the second inclined surface and a lowermost portion of the second inclined surface in a vertical direction is greater than a thickness of the one period of the active layer, and
wherein the active layer comprises a plurality of vertical distances of different thicknesses.

40. A semiconductor light emitting device, comprising:
a first gallium nitride based semiconductor layer;
an active layer on the first gallium nitride based semiconductor layer, the active layer including an uneven structure having a first inclined surface; and
a second gallium nitride based semiconductor layer on the active layer,
wherein the active layer includes at least one In-rich region at the first inclined surface of the uneven structure, the first gallium nitride based semiconductor layer comprises a second inclined surface, and at least one of the first inclined surface of the uneven structure and the second inclined surface of the first gallium nitride based semiconductor layer has vertices of different heights, wherein the active layer includes at least one period, wherein one period of the at least one period includes a well and a barrier, and wherein a distance between an uppermost portion of the second inclined surface and a lowermost portion of the second inclined surface in a vertical direction is greater than a thickness of the one period of the active layer.

41. A semiconductor light emitting device, comprising:

a first gallium nitride based semiconductor layer;

an active layer on the first gallium nitride based semiconductor layer, the active layer including at least one uneven structure having first inclined surfaces; and a second gallium nitride based semiconductor layer on the active layer, wherein the active layer includes at least one In-rich region at the first inclined surfaces of the at least one uneven structure, the first gallium nitride based semiconductor layer comprises second inclined surfaces with the active layer formed by protrusions, and at least one of the first inclined surfaces of the uneven structure and the second inclined surfaces of the first gallium nitride based semiconductor layer comprise at least one substantially V shape in a sectional view, wherein the first inclined surfaces of the at least one uneven structure have the at least one substantially V shape in a sectional view, the at least one substantially V shape has a vertex, and the vertex of the first inclined surfaces of the at least one uneven structure is positioned towards the first gallium nitride based semiconductor layer or contacts the first gallium nitride based semiconductor layer, wherein the active layer includes at least one period, wherein one period of the at least one period includes a well and a barrier, wherein a distance between an uppermost portion of the second inclined surfaces of the first gallium nitride based semiconductor layer and a lowermost portion of the second inclined surfaces of the first gallium nitride based semiconductor layer in a vertical direction is greater than a thickness of the one period of the active layer, and wherein the active layer comprises a plurality of vertical distances of different thicknesses.

* * * * *